(12) United States Patent
Abe

(10) Patent No.: US 7,053,394 B2
(45) Date of Patent: May 30, 2006

(54) RECORDING DEVICE OF MASTER DISK FOR INFORMATION RECORDING MEDIUM

(75) Inventor: Shinya Abe, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 14 days.

(21) Appl. No.: 10/485,749

(22) PCT Filed: Aug. 7, 2002

(86) PCT No.: PCT/JP02/08050

§ 371 (c)(1),
(2), (4) Date: Feb. 3, 2004

(87) PCT Pub. No.: WO03/014660

PCT Pub. Date: Feb. 20, 2003

(65) Prior Publication Data

US 2004/0232316 A1   Nov. 25, 2004

(30) Foreign Application Priority Data

Aug. 8, 2001   (JP) ............................. 2001-240779

(51) Int. Cl.
*G01V 8/00*   (2006.01)
(52) U.S. Cl. .............................. 250/559.38; 356/4.08; 356/624; 369/44.11
(58) Field of Classification Search ........... 250/559.38, 250/559.29, 559.31; 356/4.08, 615, 622, 356/623, 624
See application file for complete search history.

(56) References Cited

U.S. PATENT DOCUMENTS

| 5,929,978 A * | 7/1999 | Masaki ........................ 355/53 |
| 6,307,826 B1 | 10/2001 | Katsumura et al. |
| 6,476,904 B1 * | 11/2002 | Kubo ........................... 355/55 |
| 6,597,006 B1 * | 7/2003 | McCord et al. ......... 250/559.19 |
| 6,856,388 B1 * | 2/2005 | Schmidt .................. 356/152.2 |

FOREIGN PATENT DOCUMENTS

| JP | 6-3115 | 1/1994 |
| JP | 8-21705 | 1/1996 |
| JP | 10-318718 | 12/1998 |
| JP | 2001-56210 | 2/2001 |

* cited by examiner

*Primary Examiner*—David Porta
*Assistant Examiner*—Davienne Monbleau
(74) *Attorney, Agent, or Firm*—Hamre, Schumann, Mueller & Larson, P.C.

(57) ABSTRACT

Two light beams are incident on the same position on a surface of an object (105) to be measured obliquely from upper sides facing each other, and positions at which the reflecting light beams are incident on respective predetermined detection surfaces are detected by position detectors (102 and 104) for outputting respectively as position detection signals. The displacement of the surface to be measured is detected by obtaining the difference between or the sum of respective position detection signals so as to cancel the components in the directions opposite to each other out of the components indicating changes from the reference position included in respective position detection signals.

4 Claims, 7 Drawing Sheets

RECORDING DEVICE OF MASTER DISK FOR INFORMATION RECORDING MEDIUM

TECHNICAL FIELD

The present invention relates to a displacement detecting method for detecting the displacement of a surface of an object to be measured using light beams. More particularly, the present invention relates to a method suitable for detecting the displacement of a surface of a substrate disk when a master disk for an information recording medium such as an optical disk is produced using an electron beam as a recording beam. Further, the present invention relates to a displacement detecting device adopting the displacement detecting method, a calibrating method thereof, and a recording device of a master disk for an information recording medium using the displacement detecting device.

BACKGROUND ART

Conventionally, for recording information on a master optical disk, a blue or ultraviolet laser has been used as a recording beam, which is focused on a substrate disk coated with a photosensitive material, so that the substrate disk is exposed to the laser. At this time, the recording beam is focused by an objective lens with a relatively large numerical aperture of 0.9, for example. In this case, the depth of focus is small, and therefore, the objective lens is moved in accordance with the displacement of a surface of the substrate disk so that the focus always is located on the surface of the substrate disk.

Because of this, a system for detecting the displacement of the surface of the substrate disk is indispensable. For example, in addition to the recording beam, a long-wavelength light to which a photosensitive material is not sensitive is radiated through the same objective lens, and based on the reflected light of the long-wavelength light, the displacement of the surface of the substrate disk is detected by a focus detecting method such as an astigmatism method and a skew method. Using a feedback control that moves the position of the objective lens with a detection signal obtained by the displacement detection, an automatic focus control is performed so as to allow the focus to follow the displacement of the surface of the substrate disk.

Further, in recent years, as a recording density of optical disks becomes higher, the possibility of using an electron beam as a recording beam is being considered. However, it is difficult structurally to radiate light other than the electron beam on the surface of the substrate disk through a lens for the electron beam in the conventional manner, and accordingly, another displacement detecting means is necessary.

To this effect, an optical lever method has been developed as shown in FIG. 6, in which a substrate disk surface 403 is irradiated with oblique light, and the displacement of the substrate disk surface 403 is detected from a change in the position at which the reflected light of the oblique light is incident upon a position detector surface 402. According to this method, the light from a light source 401 is reflected by the substrate disk surface 403, and the reflected light is incident upon the position detector surface 402. At this time, if the position of the substrate disk surface 403 changes among A, B, and C, the light path of the reflected light changes among A', B', and C', respectively. The change in the light path of the reflected light is detected as a change in the position at which the light is incident upon the position detector surface 402, whereby the displacement of the substrate disk surface 403 can be detected.

However, in the conventional method as shown in FIG. 6, the change in the position of the reflected light on the position detector surface 402, which is detected as a signal, is caused not only by the displacement amount of the substrate disk surface 403 but also by the tilt of the substrate disk surface 403. The components caused by the tilt increase in proportion to the distance from a reflection point on the substrate disk surface 403 to the position detector surface 402. Accordingly, as compared with the components caused by the displacement, which remain constant independently of the distance from the reflection point to the position detector surface 402, the components caused by the tilt change at higher rates as the distance is increased. As described above, the conventional method is subject to the tilt as much as or more than the displacement of the substrate disk surface, and therefore, an accurate detection of a displacement is difficult.

In addition, in the above-described method, it is difficult to detect the focusing state of the electron beam on the substrate disk in real time during recording, and thus, the automatic focus control by feedback cannot be performed. As a result, a control based on the correspondence between the detected displacement of the surface of the substrate disk and the focus adjustment of the recording beam is required, and establishment of a particular technique for this control is desired.

DISCLOSURE OF INVENTION

In view of the above-described situations, it is an object of the present invention to provide a displacement detecting method and a displacement detecting device for detecting the displacement of a surface of a substrate disk in which the influence of a tilt is eliminated. Another object of the present invention is to provide a recording device of a master disk for an information recording medium that is capable of properly focusing a recording beam on the surface of the substrate disk, using the displacement detecting device.

A displacement detecting method of the present invention is a method for detecting a displacement of a surface of an object to be measured, based on a change in a light path of a light beam reflected by the surface of the object to be measured caused by the displacement of the surface of the object to be measured. At least two light beams are obliquely incident upon the same position on the surface of the object to be measured from upper side positions opposed to each other, position detectors detect positions at which the reflected light beams are incident upon respective predetermined detection planes and output them as position detection signals, and a difference between or a sum of the respective position detection signals is obtained so that, between components of the respective position detection signals indicating changes from a reference position, components having opposite directions to each other are canceled, thereby detecting the displacement of the surface of the object to be measured.

A displacement detecting device of the present invention includes plural light sources for emitting the light beams to the surface of the object to be measured, position detectors for respectively detecting positions at which the light beams reflected by the surface of the object to be measured are incident upon predetermined detection planes and outputting them as position detection signals, and a signal processing part for receiving the position detection signals. The respective light sources are arranged so that the light beams are obliquely incident upon the same position on the surface of the object to be measured from upper side positions opposed to each other. The signal processing part obtains a difference between or a sum of the respective position detection signals so that, between components of the respective position detection signals indicating changes from a reference position, components having opposite directions to each other are canceled, thereby detecting the displacement of the surface of the object to be measured.

According to the above-described configuration, it is possible to detect the displacement of the surface of the substrate disk with components caused by a tilt canceled. According to a conventional optical lever method, components caused by the displacement and tilt of the surface of the substrate disk cannot be separated from each other in a detected signal. However, when two light beams are incident from side positions opposed to each other, the separation becomes possible. More specifically, in the detection signals of the respective position detectors, the components caused by the displacement of the surface of the substrate disk and the components caused by the tilt have different directions of influence exerted on the detection signals. Accordingly, by obtaining the sum of or the difference between the detection signals, the components caused by the tilt can be canceled.

The displacement detecting device configured as described above can be calibrated by the following method. A stepped portion having a predetermined difference in height is provided on the surface of the object to be measured. The displacement is detected by the displacement detecting device so that the stepped portion is scanned by the light beam, and calibration is performed based on a correspondence between a displacement signal obtained by the displacement detection and the difference in height at the stepped portion.

A recording device of a master disk for an information recording medium of the present invention includes a rotating mechanism for holding and rotating a substrate disk with a recording material layer, a displacement detecting device for detecting a displacement of a surface of the substrate disk, and an irradiation device for irradiating the substrate disk with a recording beam according to information to be recorded. The recording device performs a control so that the recording beam is focused on the surface of the substrate disk based on a displacement amount detected by the displacement detecting device. The displacement detecting device configured as described above is employed as the displacement detecting device, and a focal position of the recording beam is changed based on the detected displacement amount.

Since the displacement detecting device with the above configuration is provided, the displacement of the surface of the substrate disk is detected appropriately, and the focal position of the recording beam can be changed based on the displacement amount so as to focus the recording beam always on the surface of the substrate disk.

The present invention is particularly useful in the case where the recording beam and the light beam for detecting the displacement of the surface of the substrate disk cannot be radiated through the same lens, such as the case where an electron beam is used as a recording beam.

BEST MODE FOR CARRYING OUT THE INVENTION

Hereinafter, embodiments of the present invention will be described with reference to the drawings.

(Embodiment 1)

Figure 1A:
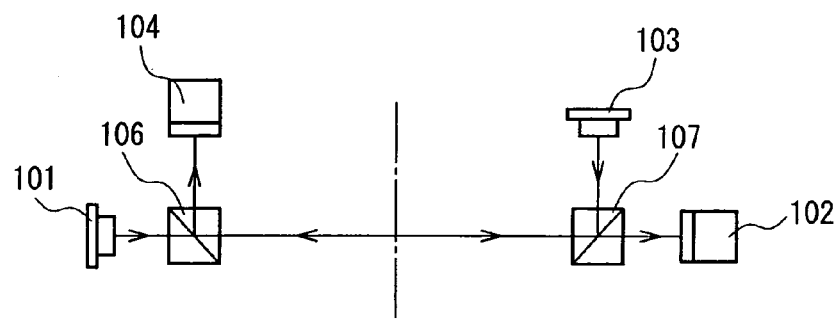
FIG. 1A is a plan view illustrating a device for carrying out a displacement detecting method according to Embodiment 1 of the present invention.
Figure 1B:
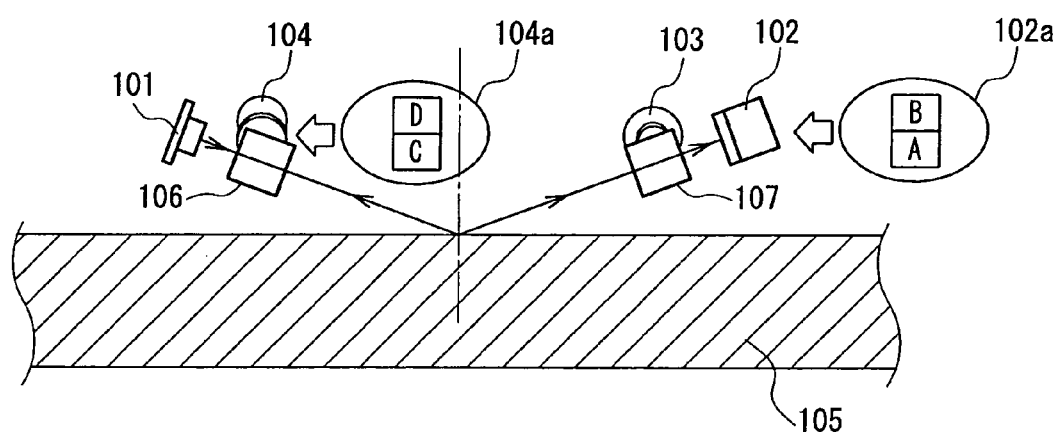
FIG. 1B is an elevational view of the above-mentioned device.

FIGS. 1A and 1B are a plan view and an elevational view, respectively, illustrating a schematic configuration of a displacement detecting device for carrying out a displacement detecting method according to Embodiment 1 of the present invention.

This device has a first irradiation detection system including a first light source 101 and a first photodiode 102, and a second irradiation detection system including a second light source 103 and a second photodiode 104. Each of the first and second light sources 101 and 103 is configured to emit linear polarized light using a semiconductor laser. Each of the first and second photodiodes 102 and 104 has a light-receiving plane divided into two portions. FIG. 1B illustrates that the light-receiving plane 102a is divided into light-receiving portions A and B, and the light-receiving plane 104a is divided into light-receiving portions C and D. Reference numeral 105 denotes a part of a substrate disk. A first polarization beam splitter 106 and a second polarization beam splitter 107 are arranged in the light paths of the first and second irradiation detection systems, respectively, so as to selectively transmit and reflect light beams. More specifically, planes of polarization are adjusted so that a light beam from the first light source 101 is transmitted through the first polarization beam splitter 106 and the second polarization beam splitter 107, and a light beam from the second light source 103 is reflected by the first polarization beam splitter 106 and the second polarization beam splitter 107. According to the above-described configuration, the light beams from the respective light sources 101 and 103 are adjusted so as to be incident upon substantially the same position on the substrate disk 105, and to pass in substantially the same light path in the opposite directions. The reflected light beams are incident upon the first photodiode 102 and the second photodiode 104, respectively.

The first and second photodiodes 102 and 104 are arranged so that dividing lines on the light-receiving planes 102a and 104a, i.e., a border line between the light-receiving portions A and B and a border line between the light-receiving portions C and D, are perpendicular to the planes of incidence of the respective light beams. Further, the arrangement of the first and second photodiodes 102 and 104 is adjusted so that spots of the respective light beams are located on the dividing lines on the light-receiving planes 102a and 104a. Preferably, the arrangement is adjusted so that the spots of the respective reflected light beams are located uniformly astride the dividing lines on the light-receiving planes 102a and 104a, when the surface of the substrate disk 105 is in a reference state, that is, located at a reference position in the vertical direction, and no tilt exists. Hence, by obtaining the difference between signals from the divided light-receiving portions A and B as well as C and D of the photodiodes 102 and 104, changes in the position of the reflected light beam on the light-receiving planes 102a and 104a can be detected. In consequence, a position detector, having the light-receiving plane 102a or 104a as a detection plane, is configured.

While it is preferable that the dividing line on each of the light-receiving planes 102a and 104a is adjusted so as to be perpendicular to the plane of incidence of the light beam as described above, the dividing line may be inclined to some degree. However, the inclination should be restricted within the range in which, for example, the difference between the amounts of light received in the light-receiving portions A and B is changed sufficiently according to the movement of the light beam. Further, FIGS. 1A and 1B illustrate the light-receiving planes 102a and 104a that are perpendicular to the light beams. However, even when the light-receiving planes 102a and 104a are arranged to be inclined with respect to the light beams, an appropriate signal can be obtained.

A description will be given with reference to FIGS. 2A and 2B regarding the states where the light paths of the light beams from the first and second light sources 101 and 102 are changed on the light-receiving planes of the first and second photodiodes 102 and 104 due to the displacement and tilt of the surface of the substrate disk 105, respectively, in the above-described arrangement.

Figure 2A:
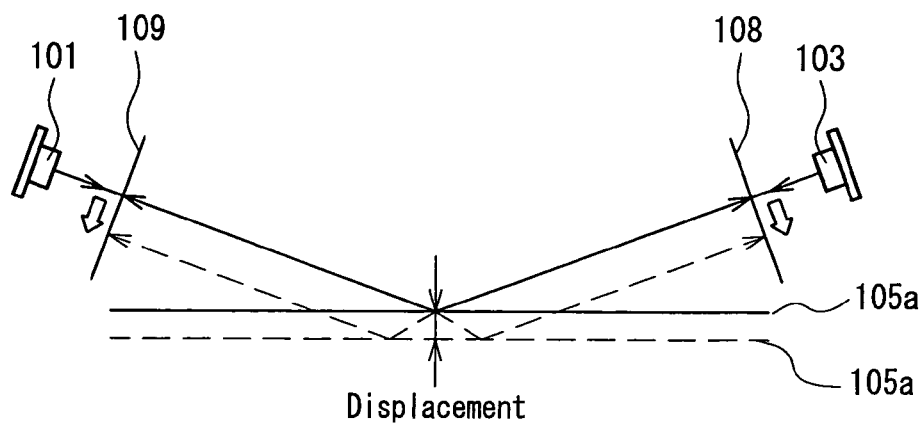
FIGS. 2A and 2B are schematic diagrams for illustrating changes in an optical axis of reflected light.

FIG. 2A illustrates the state where a substrate disk surface 105a is located at a reference position represented by a solid line and the state where the substrate disk surface 105a is located at a displaced position represented by a broken line, respectively. Screens 108 and 109 correspond to the light-receiving planes 102a and 104a in FIG. 1B, respectively. A change in the light path after the light beam from each of the first and second light sources 101 and 103 is reflected by the substrate disk surface 105a is indicated at a position on each of the screens 108 and 109.

The solid line represents the light path in which the light beam from the first light source 101 is incident upon the substrate disk surface 105a and is reflected to travel toward the screen 108, and the light path in which the light beam from the second light source 103 is incident upon the substrate disk surface 105a and is reflected to travel toward the screen 109 in the same plane of incidence, when the substrate disk surface 105a is located at the reference position. On the other hand, the broken line represents the light paths when the substrate disk surface 105a is located at the displaced position. As shown in the drawing, the movement of the position of the reflected light beam on each of the screens 108 and 109 that is caused by the displacement of the substrate disk surface 105a has the same direction as the displacement of the substrate disk surface 105a.

Figure 2B:
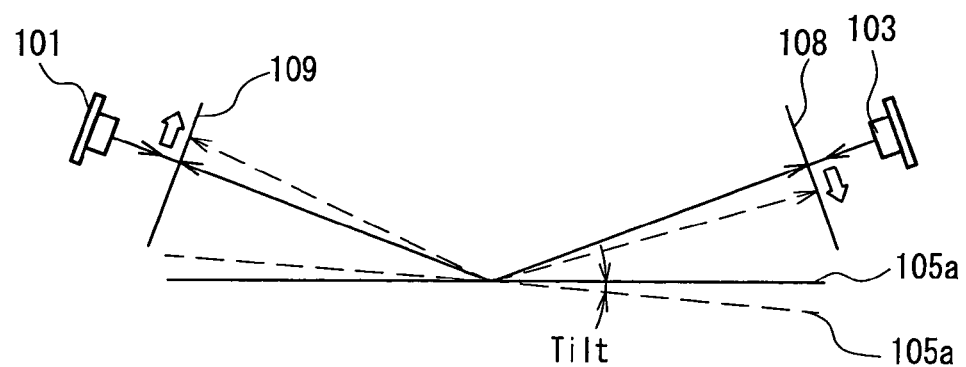

FIG. 2B illustrates a horizontal state of the substrate disk surface 105a represented by a solid line and a state having a tilt represented by a broken line. The light paths of the light beams reflected by the substrate disk surface 105a having a tilt are represented by a broken line. As shown in the drawing, both of the light paths of the light beams incident upon the screens 108 and 109 are rotated due to the tilt in the same direction as the tilt. Accordingly, the positions of incidence on the screens 108 and 109 are changed in opposite directions to each other, unlike with the case of displacement.

Thus, by using detection signals obtained according to the changes in the positions of the reflected light beams on the light-receiving planes 102a and 104a, and obtaining the difference between or the sum of the detection signals so that the components caused by the tilt are canceled, the components caused by the displacement of the substrate disk surface 105a alone can be extracted. Further, the components caused by the displacement are amplified twice as much as components to be obtained when a single irradiation detection system is used.

In the case where the signals detected from the light-receiving portions A, B, C, and D as shown in FIG. 1 are a, b, c, and d, respectively, changes in a signal (a−b) and a signal (c−d) when the substrate disk 105 is rotated will be described with reference to FIGS. 3A and 3B.

Figure 3A:
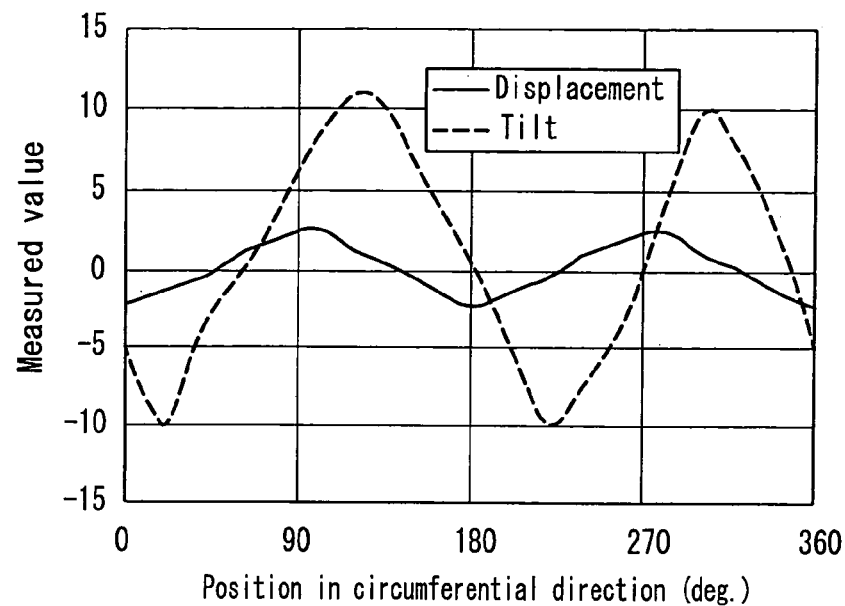
FIG. 3A is a diagram showing an example of changes in the displacement and tilt of a surface of a substrate disk in the circumferential direction.

FIG. 3A illustrates changes in the displacement and tilt of the surface of the substrate disk 105 in the circumferential direction. More specifically, FIG. 3A shows the magnitudes of the displacement and tilt of the surface of the substrate disk 105 that are observed at a fixed measuring point when the substrate disk 105 is rotated. The displacement is indicated by the height from the reference position, and the tilt is indicated by the angle between a tangential direction and a horizontal direction, each being expressed as an arbitrary unit. FIG. 3B illustrates the respective signals detected by the device as shown in FIGS. 1A and 1B with respect to the surface of the substrate disk 105 as shown in FIG. 3A.

Figure 3B:
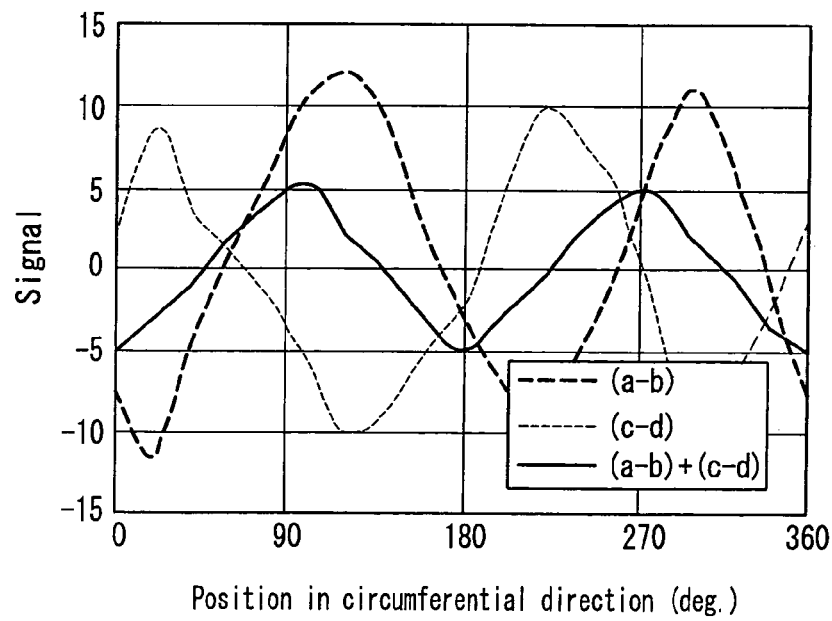
FIG. 3B is a diagram illustrating detection signals in Embodiment 1.

When the surface of the substrate disk 105 is tilted, the influences on a signal (a−b) and a signal (c−d) are reverse in polarity as shown in FIG. 3B. On the other hand, when the surface of the substrate disk 105 is displaced, the influences on the signal (a−b) and the signal (c−d) are the same in polarity. Accordingly, when a signal (a−b)+(c−d) is obtained, the components caused by the tilt are canceled, and the components caused by the displacement as shown in FIG. 3A can be detected in a doubled magnitude.

In the present embodiment, the respective signals have the polarities as shown in FIG. 3B according to the way the signals from the respective light-receiving planes are subjected to processing of arithmetic operation. In this case, the sum signal (a−b)+(c−d) is used to cancel the components caused by the tilt. However, a difference signal may be used according to the polarities obtained as the result of the signal processing.

Further, in place of the above-described photodiode having a light-receiving plane divided into two portions, other elements capable of detecting a position of light, such as a PSD (position-sensitive detector), can be used as position detecting means in the present embodiment so as to achieve the same effects.

(Embodiment 2)

Figure 4A:
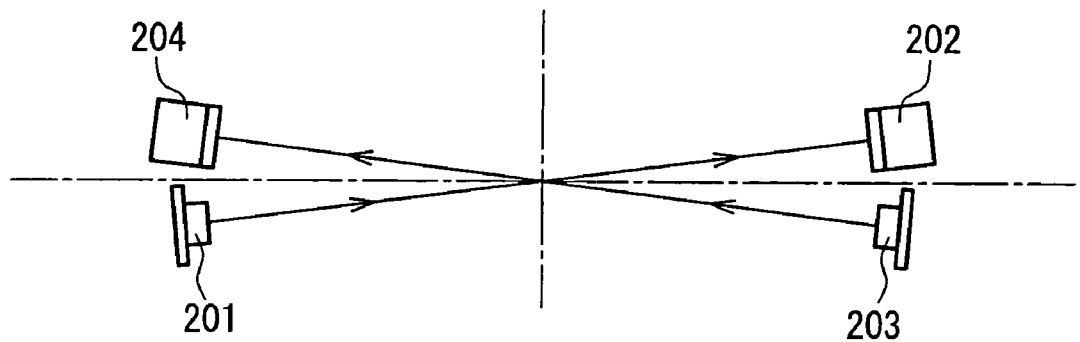
FIG. 4A is a plan view illustrating a device for carrying out a displacement detecting method according to Embodiment 2 of the present invention.
Figure 4B:
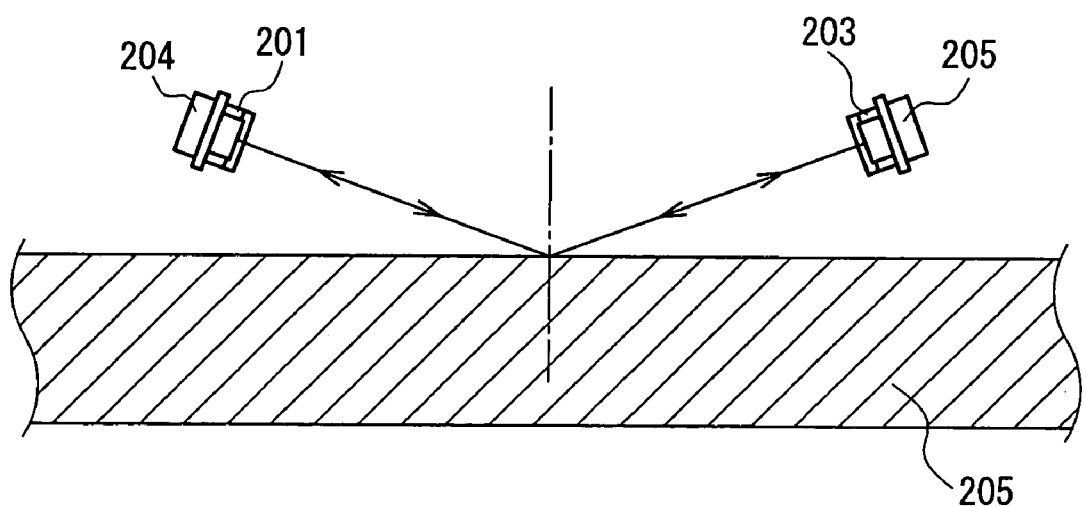
FIG. 4B is an elevational view of the above-mentioned device.

FIGS. 4A and 4B are a plan view and an elevational view, respectively, illustrating a schematic configuration of a displacement detecting device for carrying out a displacement detecting method according to Embodiment 2 of the present invention.

This device has a first irradiation detection system that includes a first light source 201 using a semiconductor laser and a first photodiode 202 having a light-receiving plane divided into two portions, and a second irradiation detection system that includes a second light source 203 using a semiconductor laser and a second photodiode 204 having a light-receiving plane divided into two portions. The first and second light sources 201 and 203 are arranged so as to be substantially opposed to each other. The light beams from the respective light sources are incident upon substantially the same position on a substrate disk 205, and the reflected light beams are incident upon the first and second photodiodes 202 and 204, respectively. In order to realize this system, the first and second irradiation detection systems are arranged so that the respective optical axes are at angle to each other.

Each of the first and second photodiodes 202 and 204 is arranged so that a dividing line on the light-receiving plane is perpendicular to the plane of incidence of the light beam. Further, the arrangement of the first and second photodiodes 202 and 204 is adjusted so that the reflected light beam is located uniformly astride the dividing line on the light-receiving plane when the surface of the substrate disk 205 is in a reference state.

By obtaining the difference between signals from the divided light-receiving portions of each of the photodiodes 202 and 204, changes in the position of the reflected light beam on the light-receiving plane are detected as in Embodiment 1. In this manner, position detecting means can be configured.

Also in this arrangement, the displacement of the surface of the substrate disk 205 can be detected by performing an arithmetic operation of the signals obtained from the respective light-receiving planes as in Embodiment 1.

In the present embodiment, as the angle formed between the optical axes of the first and second irradiation detection systems is smaller, the influence of a tilt detected by the respective photodiodes can be canceled more effectively. Accordingly, it is preferable that this angle is as small as possible, and the angle is set smaller than 90 degrees, and desirably, equal to or smaller than 45 degrees.

(Embodiment 3)

Figure 5A:
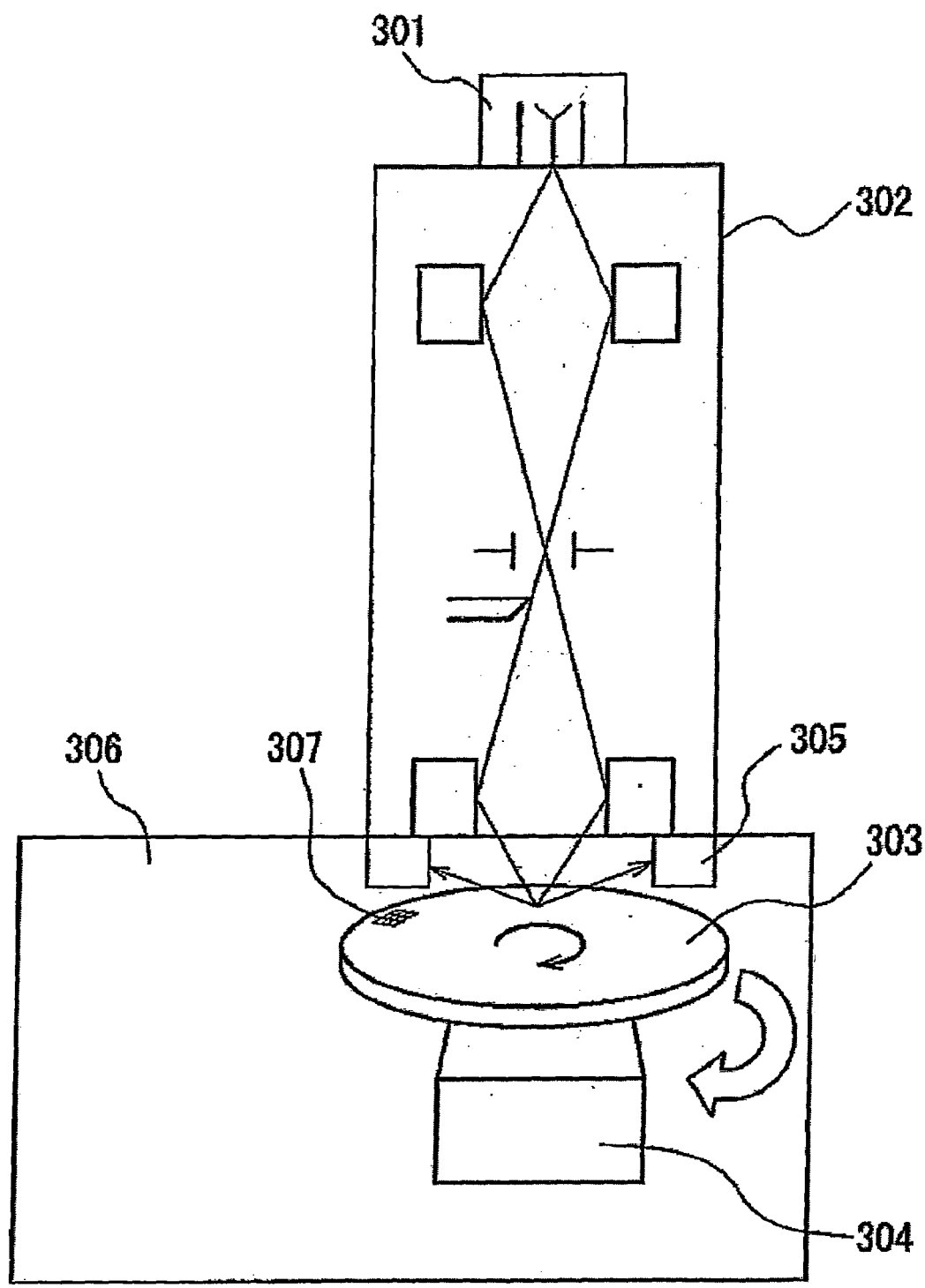
FIG. 5A is a schematic diagram illustrating a recording device of a master disk for an information recording medium according to Embodiment 3 of the present invention.

A schematic configuration of a recording device of a master disk for an Information recording medium according to Embodiment 3 of the present Invention is shown in FIG. 5A.

Reference numeral 301 denotes an electron gun used as a recording beam source. An electrostatic lens 302 is arranged under the electron gun 301, for focusing and polarizing an electron beam. A turntable 303 is provided under the electrostatic lens 302, for holding and rotating a substrate disk (not shown) coated with a photosensitive material. A drive system 304 for moving the turntable 303 is located under the turntable 303. A displacement detecting device 305 as described in the above embodiments is provided between the turntable 303 and the electrostatic lens 302, for detecting the displacement of a surface of the substrate disk mounted on the turntable 303. The turntable 303, the drive system 304, and the displacement detecting device 305 are contained in a vacuum chamber 306.

In this device, the displacement detecting device 305 is set so as to allow a light beam for displacement detection to be incident upon a position substantially the same as a recording point on the substrate disk irradiated with the electron beam as a recording beam. Therefore, the displacement detecting device 305 detects the displacement of the surface of the substrate disk that is generated at the recording point with the rotation of the turntable 303.

Based on the displacement amount detected by the displacement detecting device 305, the electrostatic lens 302 is adjusted to change the focal position of the recording beam, whereby the focus of the recording beam is controlled so as to be always located at the recording point on the surface of the substrate disk.

In the above-described device, a feedback control is not performed by actually detecting the focusing state of the recording beam on the substrate disk, but an indirect control for adjusting the focal position of the recording beam is performed according to changes in the position of the surface of the substrate disk. Therefore, preliminary calibrations are required for the correspondence between a signal output from the displacement detecting device 305 and an actual displacement amount of the surface of the substrate disk, and the correspondence between a setting condition for the adjustment of the electrostatic lens 302 and a change in the focal position of the recording beam. Hereinafter, a configuration for such calibrations will be described.

Around the periphery of the surface of the substrate disk held on the turntable 303, a groove with a predetermined depth is formed previously. A change amount of a detection signal from the displacement detecting device 305 when this groove is scanned corresponds to the predetermined groove depth, i.e., the difference in height at the stepped portion, in the state. Thus, based on the correspondence between the difference in height and the change amount of the detection signal, the correspondence between the detection signal from the displacement detecting device 305 and the displacement amount of the substrate disk surface is known. Based on this correspondence, the magnitude of a signal to be added to the electrostatic lens 302 is calibrated with respect to the magnitude of the detection signal from the displacement detecting device 305. Therefore, the focus of the electron beam as a recording beam can be controlled to be kept always on the surface of the substrate disk to accommodate the displacement of the surface of the substrate disk generated upon the rotation of the turntable 303.

In order to confirm that the recording beam is focused on the surface of the substrate disk, a grid pattern (focus grid) 307 is formed on the surface of the substrate disk. By scanning an area including the focus grid 307 by the recording beam, and observing the reflection electron image or the secondary electron image obtained at that time, a focusing state can be confirmed. This method is a common technique used in the field of SEM (scanning electron microscope) or the like. Further, the same effect also can be obtained by providing a standard sample such as a polystyrene latex ball on the surface of the substrate disk and recognizing the image thereof.

Further, it is also possible to adopt another method that uses a grid positioned at the same height as the surface of the substrate disk or at a predetermined height, in addition to the substrate disk. A focus adjustment of the recording beam is performed based on the reflection electron image or the secondary electron image obtained when the grid is scanned by the recording beam. Alternatively, a focus adjustment of the recording beam can be performed by measuring the diameter of the recording beam from the amount of electric current shut off by the grid and a scanning length when the grid is scanned by the recording beam, and adjusting the electrostatic lens 302 so that the diameter of the beam becomes smaller.

Figure 5B:
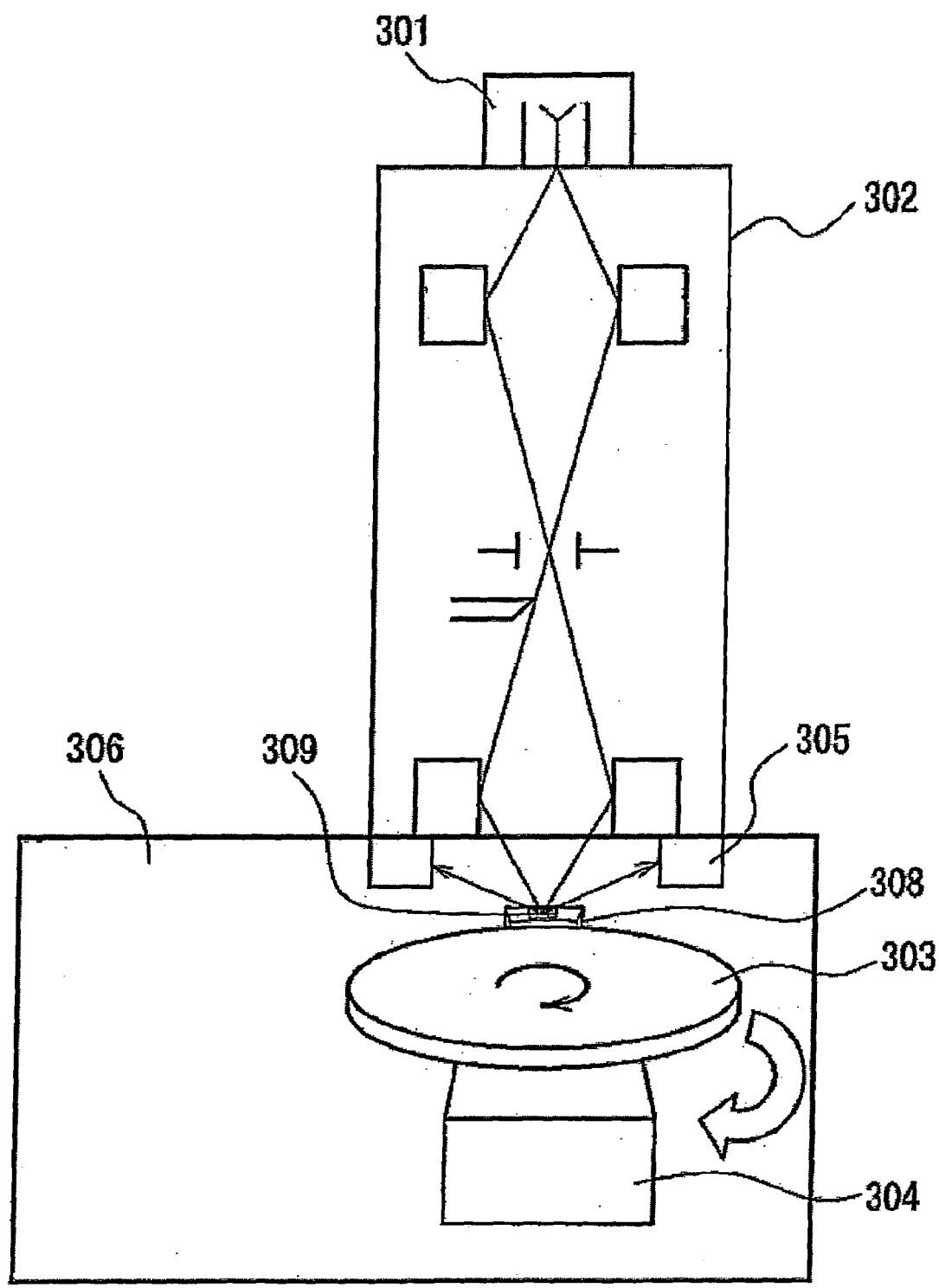
FIG. 5B is a schematic diagram illustrating a recording device of a master disk for an information recording medium according to Embodiment 4 of the present invention.
Figure 6:
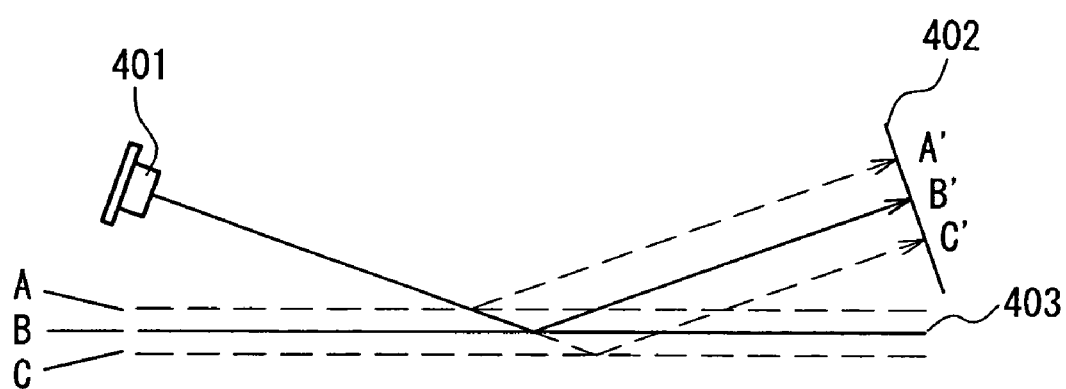
FIG. 6 is a schematic diagram for illustrating a conventional displacement detecting method.

FIG. 5B illustrates another method that uses a grid 309. A pattern formation part 308 can be seen to position the grid 309 at the same height as the surface of the substrate disk or at a predetermined height, in addition to the substrate disk.

A focus adjustment of the recording beam is performed based on the reflection electron image or the secondary electron image obtained when the grid is scanned by the recording beam. Alternatively, a focus adjustment of the recording beam can be performed by measuring the diameter of the recording beam from the amount of electric current shut off by the grid and a scanning length when the grid is scanned by the recording beam, and adjusting the electrostatic lens 302 so that the diameter of the beam becomes smaller.

In this case, it is preferable that the direction in which the light beam from the displacement detecting device 305 passes is set at a direction orthogonal to the direction of the radius of the turntable 303, i.e., a tangential direction. When the surface of the substrate disk is curved, the tilt of the surface changes depending upon the recording radius. A change in the direction of the reflected light beam caused by the tilt corresponds to the movement of the position of incidence in parallel with a dividing line on a light-receiving plane when the light beam passes in the tangential direction. As a result, the influence on the signals detected from each of the light-receiving planes can be eliminated.

It is not necessarily required that the position of light beam irradiation by the displacement detecting device 305 should be in agreement with the recording point as mentioned above. For example, the position of light beam irradiation can be set at a point, which is the same as the recording point in the radius direction but is different in the circumferential direction, on the turntable 33. In this case, it is required to calculate a time lag between the position of light beam irradiation and the recording point, and to make a displacement amount detected by the displacement detecting device 305 correspond to the time lag, thereby applying the displacement amount corresponding to the time lag to the adjustment of the electrostatic lens 302.

Further, in order to keep the focal position of the recording beam on the surface of the substrate disk, it is possible to use methods other than the one that adjusts the electrostatic lens 302 to change the focal position of the recording beam. For example, a mechanism for dynamically changing the height of the surface of the substrate disk held on the turntable 303 may be provided, so that the height of the surface of the substrate disk is adjusted according to the displacement amount detected by the displacement detecting device 305.

Furthermore, the light-receiving plane may be divided into four portions by a further dividing line that is perpendicular to the dividing line for dividing this plane into two. In this case, the position of the reflected light beam and the amount of the tilt of the surface depending on the recording radius may be detected simultaneously.

INDUSTRIAL APPLICABILITY

According to a displacement detecting method of the present invention, when the displacement of a surface of an object to be measured is detected based on a change in a light path of a reflected light beam from the surface of the object to be measured, the detection of the displacement of the surface can be performed without being influenced by the tilt of the surface of the object to be measured. Therefore, in the case of production of a master optical disk, for example, the displacement of a surface of a substrate disk can be detected appropriately even when it is difficult to pass a light beam for displacement detection through a lens for a recording beam with the recording beam.

A displacement detecting device of the present invention is installed in a recording device of a master disk for an information recording medium, and the focal position of a recording beam is controlled based on an output of the displacement detecting device, whereby the focus of the recording beam can be controlled to be kept always on the surface of the substrate disk.

What is claimed is:

1. A recording device of a master disk for an information recording medium, comprising:
    a rotating mechanism for holding and rotating a substrate disk with a recording material layer;
    a displacement detecting device for detecting a displacement of a surface of the substrate disk, based on a change in a light path of a light beam reflected by the surface of the substrate disk caused by the displacement of the surface of the substrate disk; and
    an irradiation device for irradiating the substrate disk with an electron beam according to information to be recorded, the recording device performing a control so that the recording beam is focused on the surface of the substrate disk based on a displacement amount detected by the displacement detecting device,
    wherein the displacement detecting device comprises:
    plural light sources for emitting the light beams to the surface of the substrate disk; position detectors for respectively detecting positions at which the light beams reflected by the surface of the substrate disk are incident upon predetermined detection planes and outputting them as position detection signals; and a signal processing part for receiving the position detection signals,
        wherein the respective light sources are arranged so that the light beams are obliquely incident upon the same position on the surface of the substrate disk from upper side positions opposed to each other, and
        the signal processing part obtains a difference between or a sum of the respective position detection signals so that, between components of the respective position detection signals indicating changes from a reference position, the components due to, changes in reflection angles of the respective reflected beams that are caused by a tilt of the surface of the substrate disk are canceled with respect to each other, thereby detecting the displacement of the surface of the substrate disk,
    wherein the recording device further comprises a secondary electron detector for detecting a secondary electron when the substrate disk is irradiated with the recording beam, wherein in a state where the substrate disk on the surface of which a pattern for adjusting a focus of the recording beam is formed is loaded, the secondary electron image obtained when an area including the pattern is scanned by the recording beam is detected by the secondary electron detector, thereby enabling a focus adjustment of the recording beam, and
    wherein the focus adjustment of the recording beam is performed using the pattern formed on the substrate disk, and a position of light beam irradiation by the displacement detecting device is made in agreement with a position of the pattern, whereby the position of light beam irradiation can be adjusted to be in agreement with a position of recording beam irradiation.

2. The recording device of a master disk for an information recording medium according to claim 1, wherein a light intensity detecting element having a light-receiving plane divided into at least two portions is used as the position detector, and the reflected light beam is incident upon a dividing line on the light-receiving plane, and the position of the reflected light beam is detected based on the difference between the respective detection signals from the divided light-receiving planes.

3. A recording device of a master disk for an information recording medium, comprising:

a rotating mechanism for holding and rotating a substrate disk with a recording material layer;

a displacement detecting device for detecting a displacement of a surface of the substrate disk, based on a chance in a light path of a light beam reflected by the surface of the substrate disk caused by the displacement of the surface of the substrate disk; and an irradiation device for irradiating the substrate disk with an electron beam according to information to be recorded, the recording device performing a control so that the recording beam is focused on the surface of the substrate disk based on a displacement amount detected by the displacement detecting device, wherein the displacement detecting device comprises:

plural light sources for emitting the light beams to the surface of the substrate disk; position detectors for respectively detecting positions at which the light beams reflected by the surface of the substrate disk are incident upon predetermined detection planes and outputting them as position detection signals; and a signal processing part for receiving the position detection signals, wherein the respective light sources are arranged so that the light beams are obliquely incident upon the same position on the surface of the substrate disk from upper side positions opposed to each other, and the signal processing part obtains a difference between or a sum of the respective position detection signals so that, between components of the respective position detection signals indicating changes from a reference position, the components due to changes in reflection angles of the respective reflected beams that are caused by a tilt of the surface of the substrate disk are canceled with respect to each other, thereby detecting the displacement of the surface of the substrate disk, and wherein the recording device further comprises a pattern formation part where a pattern for adjusting the focus of the recording beam is formed, in the vicinity of a position where the substrate disk is loaded, wherein a focus adjustment of the recording beam is performed using the pattern of the pattern formation part, and a position of light beam irradiation by the displacement detecting device is made in agreement with a position of the pattern, whereby the position of light beam irradiation can be adjusted to be in agreement with a position of recording beam irradiation.

4. The recording device of a master disk for an information recording medium according to claim 3, wherein a light intensity detecting element having a light-receiving plane divided into at least two portions is used as the position detector, and the reflected light beam is incident upon a dividing line on the light-receiving plane, and the position of the reflected light beam is detected based on the difference between the respective detection signals from the divided light-receiving planes.

* * * * *

UNITED STATES PATENT AND TRADEMARK OFFICE
CERTIFICATE OF CORRECTION

PATENT NO.       : 7,053,394 B2                                    Page 1 of 1
APPLICATION NO.  : 10/485749
DATED            : May 30, 2006
INVENTOR(S)      : Abe It is certified that error appears in the above-identified patent and that said Letters Patent is hereby corrected as shown below:

Column 11, line 12(claim 3): "chance" should read --change--

Signed and Sealed this

Sixteenth Day of January, 2007

JON W. DUDAS
*Director of the United States Patent and Trademark Office*